(12) United States Patent
Brunette et al.

(10) Patent No.: US 11,616,279 B2
(45) Date of Patent: Mar. 28, 2023

(54) STACKABLE RF FILTER FOR A RECEIVER OR TRANSMITTER

(71) Applicant: ThinkRF Corporation, Kanata (CA)

(72) Inventors: Gilbert Brunette, Ottawa (CA); Jeffrey Michael Hill, Ottawa (CA); Theodore Pantazopoulos, Ottawa (CA); Jasvinder Singh Obhi, Ottawa (CA)

(73) Assignee: ThinkRF Corporation, Kanata (CA)

( * ) Notice: Subject to any disclaimer, the term of this patent is extended or adjusted under 35 U.S.C. 154(b) by 343 days.

(21) Appl. No.: 16/676,279

(22) Filed: Nov. 6, 2019

(65) Prior Publication Data
US 2020/0168970 A1    May 28, 2020

Related U.S. Application Data

(60) Provisional application No. 62/771,217, filed on Nov. 26, 2018.

(51) Int. Cl.
| | |
|---|---|
| H01P 1/203 | (2006.01) |
| H04B 1/16 | (2006.01) |
| H04B 1/00 | (2006.01) |
| H05K 9/00 | (2006.01) |
| H05K 7/02 | (2006.01) |
| H01P 3/08 | (2006.01) |
| H05K 1/14 | (2006.01) |

(52) U.S. Cl.
CPC ............... *H01P 1/203* (2013.01); *H01P 3/08* (2013.01); *H04B 1/006* (2013.01); *H04B 1/16* (2013.01); *H05K 7/023* (2013.01); *H05K 9/0039* (2013.01); *H05K 1/144* (2013.01); *H05K 2201/10053* (2013.01)

(58) Field of Classification Search
CPC ........... H01P 1/203; H01P 3/08; H04B 1/006; H04B 1/16; H05K 7/023; H05K 9/0039; H05K 1/144; H05K 2201/10053
See application file for complete search history.

(56) References Cited

U.S. PATENT DOCUMENTS

| | | | | |
|---|---|---|---|---|
| 3,051,897 | A * | 8/1962 | Coker | G01D 1/14 |
| | | | | 324/76.31 |
| 5,912,750 | A * | 6/1999 | Takeda | H04J 14/0221 |
| | | | | 398/79 |
| 6,826,371 | B1 * | 11/2004 | Bauch | H04L 27/18 |
| | | | | 398/183 |
| 8,811,817 | B2 * | 8/2014 | Sakauchi | H04J 14/02 |
| | | | | 398/56 |
| 2006/0017525 | A1 * | 1/2006 | Goyette | H01P 1/20336 |
| | | | | 333/205 |

(Continued)

*Primary Examiner* — Hafizur Rahman
*Assistant Examiner* — Kimberly E Glenn
(74) *Attorney, Agent, or Firm* — Stratford Group Ltd.

(57) ABSTRACT

A receiver or transmitter designed for a broad range of frequencies requires a pre-select filter for incoming signals or a post-select filter for outgoing signals to minimize spurious signal responses. In conventional receivers, several discrete RF filters are used and a switched filter bank is created utilizing a large amount of space. A filter bank comprising a plurality of stacked shielded filters would enable different filter technologies and topologies to be used together, as other passive and active circuits may be combined into the one surface mountable component in order to save on PCB space.

15 Claims, 14 Drawing Sheets

(56) References Cited

U.S. PATENT DOCUMENTS

2017/0033773 A1\* 2/2017 Reid .................... H03H 19/004
2019/0081380 A1\* 3/2019 Bates .................. H01L 25/0655
2021/0124106 A1\* 4/2021 Wetle ...................... G01S 19/36

\* cited by examiner

STACKABLE RF FILTER FOR A RECEIVER OR TRANSMITTER

CROSS-REFERENCE TO RELATED APPLICATIONS

This application claims priority from U.S. patent application Ser. No. 62/771,217, filed Nov. 26, 2018, which is incorporated herein by reference.

TECHNICAL FIELD

The present invention relates to an RF filter, and in particular to a stacked RF filter for mounting on a printed circuit board.

BACKGROUND

When a receiver or transmitter is designed for a very broad range of frequencies, there is a need to pre-filter incoming signals or post-filter outgoing signals to minimize spurious signal responses. Typically, several discrete RF filters are used and a switched filter bank is created. The filter bank comprises a 1×N switch on either end interconnected by N PCB tracks, each track including a RF frequency filter, which can be selected by connecting both of the switches to the desired PCB track. Unfortunately, several issues arise from a classical filter bank design:
1. The filter bank incurs signal loss along the PCB tracks from the switches leading to the filters. The PCB tracks can be electrically long at the given frequencies used and hence very lossy; 2. The filter bank consumes a lot of PCB floorspace; 3. Mechanical shielding between filters is usually required to enhance and maintain performance of the filters such that they dominate the expected filtering performance of the signals passing through them; and 4. Often, the filters at very high frequencies are part of the PCB design itself in order to save on component costs, but at the expense of dedicating the PCB to their performance. If the filters don't work well due to poor material properties selection, material properties control or filter design, the entire board is subject to scrapping due to poor filter performance.

Testing of conventional filters printed on the PCB itself can be difficult if not impossible depending on the frequency range or other mechanical limitations of getting test signals into and out of the filters. In particular, at very high frequencies, launching signals into and out of components with good fidelity or accuracy without making special provisions for connectors that take up board space, is very difficult. Higher frequency filters are often printed on the PCB and as such, become an integral part thereof. However, if the filter does not meet spec for some reason, e.g. etching accuracy being off, the whole board may have to be scrapped.

An object of the present invention is to overcome the shortcomings of the prior art by providing a filter bank comprising a plurality of stacked shielded filters. Additionally, mixed substrate materials may be used so that different filter technologies and topologies, as well as other passive and active circuits, may be combined into one surface mountable component. The filter stack also addresses the need for a filter bank in other circuits, such as broadband PLLs in receivers, transmitters or even signal generators, etc.

SUMMARY OF THE INVENTION

Accordingly, the present invention relates to an RF filter device for mounting on a PCB comprising:

an input switch including at least one input for inputting an input signal and a plurality of outputs;

a filter stack including a plurality of filters, each filter connected to one of the plurality of outputs from the input switch and capable of filtering a selected frequency range;

an output switch including a plurality of inputs, and at least one output for outputting a filtered signal, each input connected to one of the plurality of filters;

wherein the filter stack comprises a plurality of superposed filters, each filter comprising: a filter layer; a dielectric layer on each side of the filter; and metal insulation layers above and below the dielectric layers for insulating each filter from other filters above and/or below.

Another aspect of the present invention relates to an RF filter stack for mounting on a PCB and including a plurality of filters, each filter capable of filtering a selected frequency range from an input signal, and capable of connecting to one of a plurality of outputs from an input switch receiving the input signal, and to one of a plurality of inputs from an output switch for outputting a filtered output signal;

wherein the filter stack comprises a plurality of superposed filters, each filter comprising: a filter layer; a dielectric layer on each side of the filter; and metal insulation layers above and below the dielectric layers for insulating each filter from other filters above and/or below.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
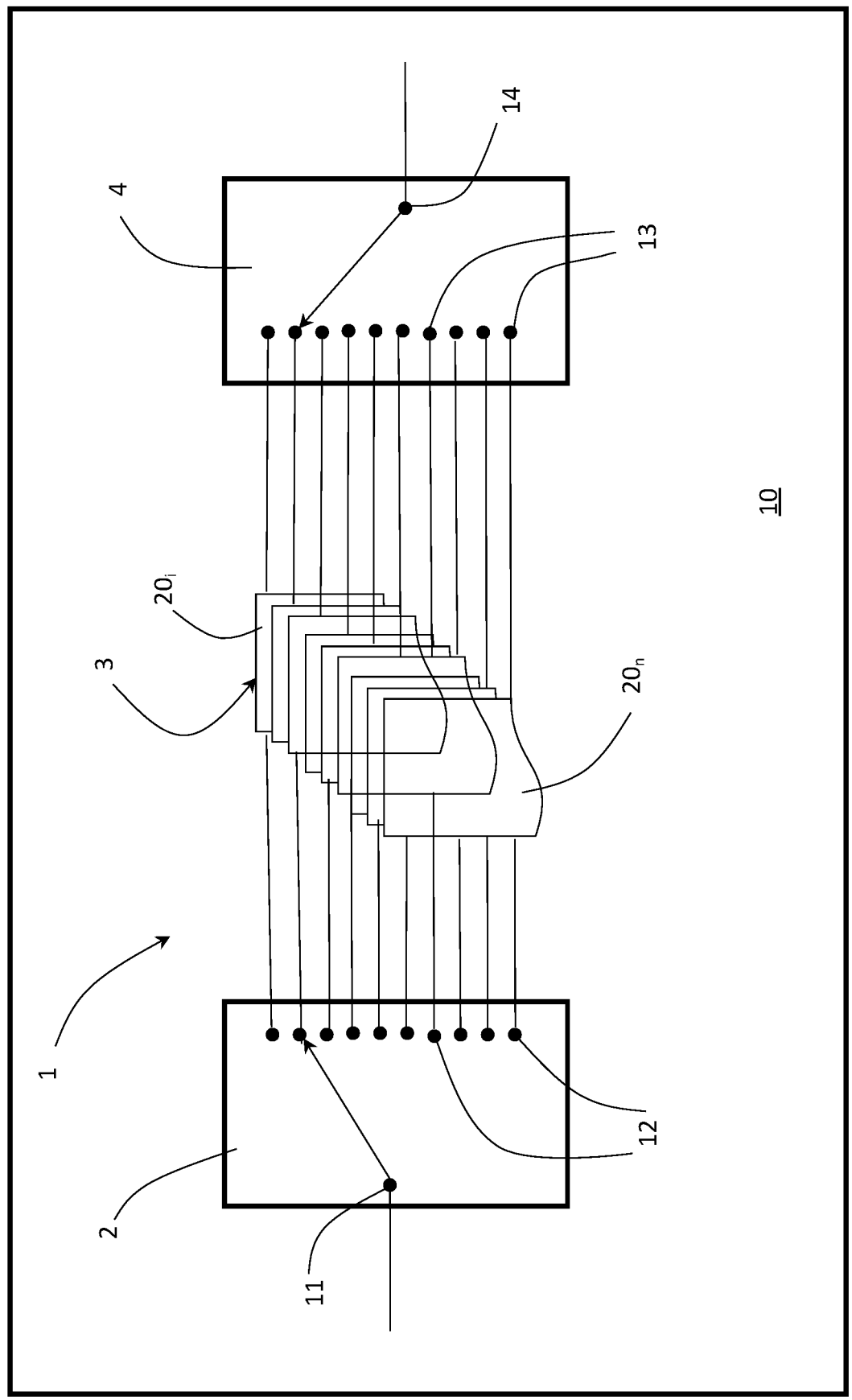
FIG. 1 is a schematic diagram of a RF filter device in accordance with an embodiment of the present invention.

While the present teachings are described in conjunction with various embodiments and examples, it is not intended that the present teachings be limited to such embodiments. On the contrary, the present teachings encompass various alternatives and equivalents, as will be appreciated by those of skill in the art.

An RF filter device 1 of the present invention may comprises an input switch 2, an RF filter stack 3 comprised of a plurality of superposed filters $20_i$ to $20_n$, and an output switch 4. The input switch 2 includes at least one input or input port 11, and a plurality of outputs or output ports 12, but a plurality of inputs or input ports 11 is also possible. Similarly, the output switch 4 includes a plurality of inputs 13 and at least one output 14, but a plurality of outputs 14 is also possible. Each output 12 of the input switch 2 is connected to one of the inputs 13 of the output switch 4 via a filter in the filter stack 3. The RF filter device 1 may be mounted on a printed circuit board (PCB) 10 utilizing conventional multi-pin or ball-grid array; however, an arrangement using connectors is also possible, as hereinafter described. The filter stack 3 also enables the filters 20 to be tested individually to ensure their performance is met before being mounted on the PCB 10.

Each filter $20_i$-$20_n$ may include an RF bandpass filter providing a very wide range of filtering for an RF spectrum analyzer, e.g. from 0.10 MHz to 40 GHz. For example: the frequency ranges for each filter $20_i$-$20_n$ may include any combination of a plurality of RF ranges, e.g. five, including Very High RF (8.0-40.0 GHz), High RF (3.0-8.0 GHz), Mid RF (400 MHz-4.4 GHz), Low RF (40-1000 MHz) and Very low RF (0.1-50 MHz).

Figure 2:
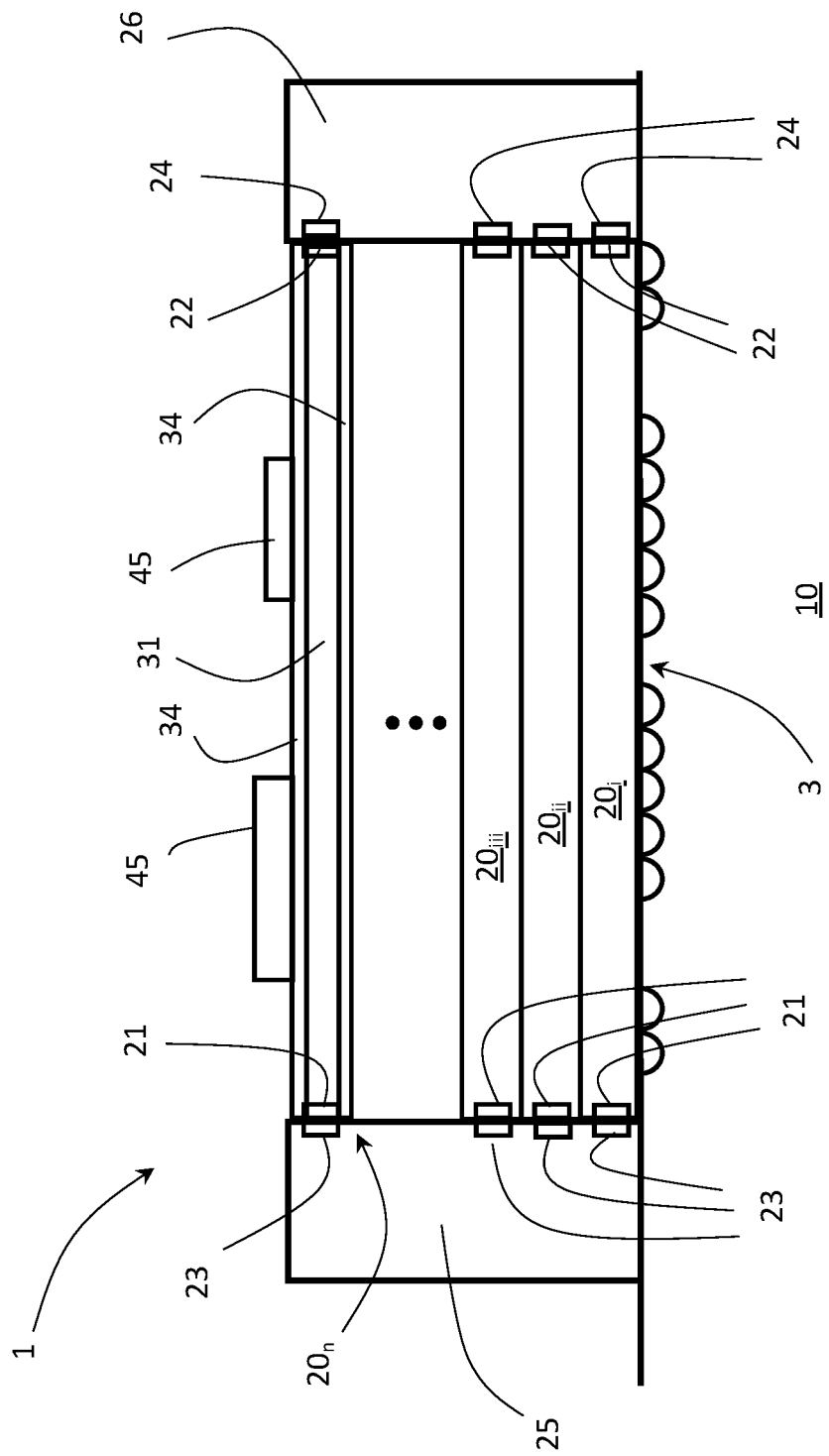
FIG. 2 is a side view of a filter stack of the RF filter device of FIG. 1.
Figure 3A:
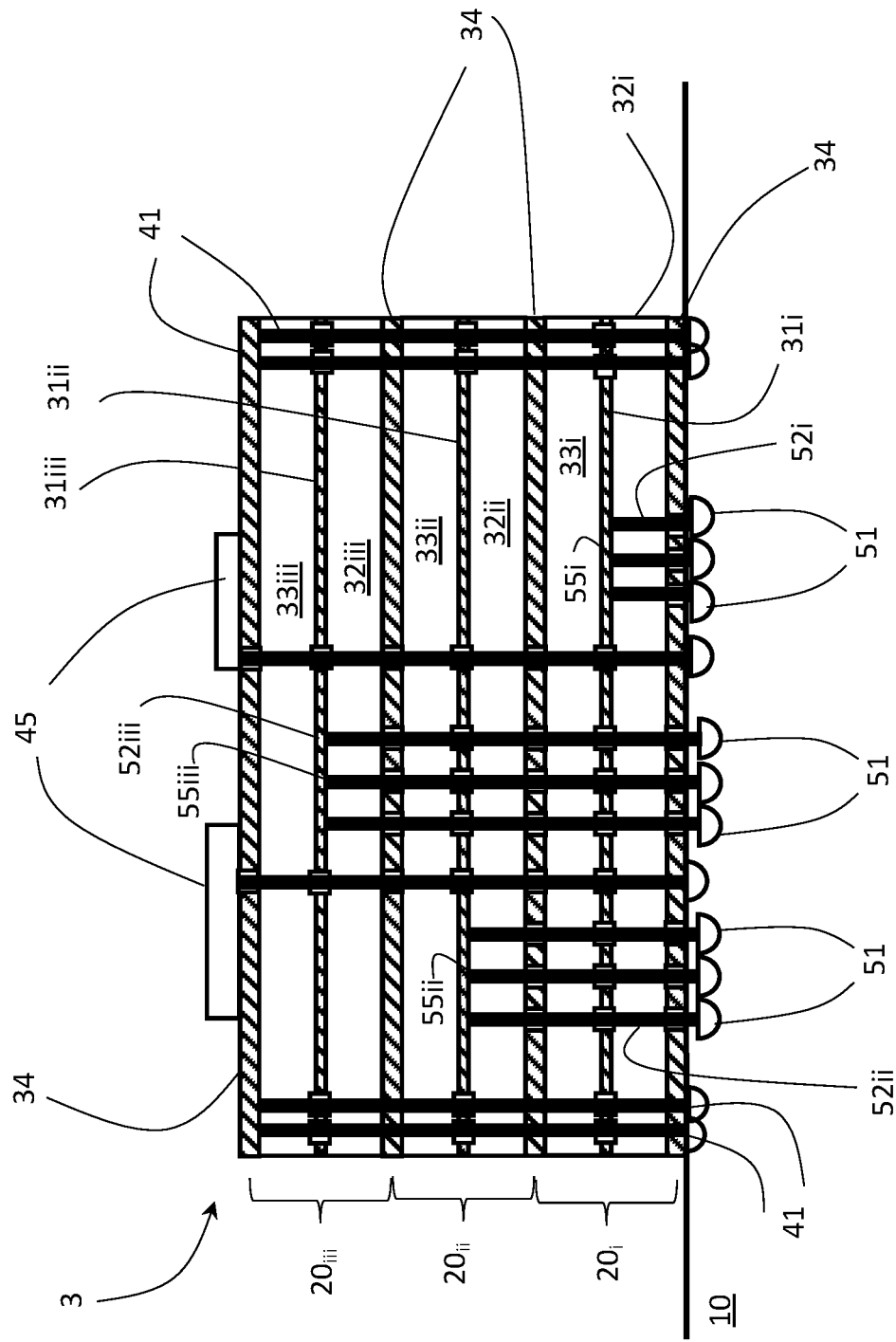
FIG. 3A is a cross-sectional view of an alternate embodiment of a filter stack of the RF filter device of FIG. 1.

With reference to FIGS. 2 and 3A, each filter $20_i$-$20_n$ of the filter stack 3 may include input connectors 21 on one or more sides and output connectors 22 on the other free sides, or a combination of input connectors 21, output connectors 22 and ball grid array (BGA) contacts 51, as hereinafter described. The input connectors 21 mounted on a side of each filter $20_i$-$20n$ may correspond to a mating connector 23 on a suitable multi-connector device 25, mounted on a side of the RF filter stack 3. Similarly, the output connectors 22 mounted on the same side or a different side, e.g. opposite side, of each filter $20_i$ to $20n$ may correspond to a mating connector 24 on a suitable multi-connector device 26, mounted on a side, e.g. opposite the multi-connector device 25, of the RF filter stack 3. The connectors 21-24 may comprise any suitable miniature connectors, such as AMMC (Amphenol Micro-Miniature Coaxial) connectors. The multi-connector devices 25 and 26 may be electrically connected to traces on the PCB 10 or to an external wiring, e.g. ribbon, array. Only four filters $20_i$ to $20n$ are illustrated in FIG. 2, and only three filters $20_i$-$20_{iii}$ are illustrated in FIG. 3A; however, more or less filters may be included. Each filter $20_i$ to $20n$ may include a plurality of layers in the filter stack 3. For example, a simple strip-line filter, illustrated in FIG. 2, may include a first ground layer 34, a signal filter layer 31, plus a second ground layer 34. The ground layers 34 may be re-used for the next stacked strip-line filter $20_i$-$20n$ so the total number of layers may not match or even be a multiple of the number of filters n.

With reference to FIG. 3A, each of the filters $20_i$-$20_n$ may comprise a planar metallization filter layer $31i$-$31n$ (only three layers $31ii$-$31ii$ are illustrated for simplicity) on a dielectric substrate $32i$-$32n$. There may be another upper dielectric layer $33i$-$33n$ above the filter layer $31i$-$31n$, whereby each filter layer $31i$-$31n$ may be sandwiched between two dielectric layers, i.e. the dielectric substrate $32i$-$32n$ and the upper dielectric layer $33i$-$33n$, respectively. The dielectric layers, i.e. the dielectric substrate $32i$-$32n$ and the upper dielectric layer $33i$-$33n$, may have metallization or ground layers 34 applied to them at their outer parallel planar surfaces. The metallization or ground layers 34 may provide the isolation boundaries between adjacent filters $20_i$-$20_n$ including the filter layer $31i$-$31n$ sandwiched between dielectric layers, i.e. the dielectric substrate $32i$-$32n$ and the upper dielectric layer $33i$-$33n$.

The dielectric substrates $32i$-$32n$, may be electrically insulative, e.g. fiberglass, ceramic or glass, although semiconductor material might also be used, which would allow for one or more of the filters $20_i$-$20_n$ to be used for optical instead of electrical purposes. For example $LiNbO_3$ or other transparent or semi-transparent material, would also allow for opto-electrical components designs, such as a Mach-Zehnder modulators acting as filters etc, as herein after discussed.

The ground layers 34 above and below each filter $20_i$-$20_n$ may also provide a means to insulate each filter $20_i$-$20_n$ from the other filters $20_i$-$20_n$ by forming a shielded layer. In particular, when castellations 42 (FIG. 3B) are provided around the perimeter of some or all of the layers of the RF filter stack 3 and/or interconnecting stack ground vias 41 are provided that electrically connect all the ground layers 34, multiple Faraday cages may be formed around each filter $20_i$-$20_n$, thereby providing the insulated/isolating function. The stack ground vias 41 may be provided in a single or double row of ground vias 41 extending through the RF filter stack 3 around the periphery thereof in contact with each ground layer 34, but insulated from each filter layer $31i$ to $31n$; however, any suitable arrangement, is possible. Individual signal ground vias $52i$ to $52n$ may also be provided for isolating individual signals from each filter layer $31i$-$31n$ from other filter layers $31i$-$31n$. The signal ground vias $52i$ to $52n$ extend from the corresponding filter layer $31i$-$31n$, respectively, and through, i.e. insulated from, lower filter layers $31ii$ to $31n$. The signal ground vias $52i$ to $52n$ may surround or at least partially surround a central signal conductive via 55.

The sequence of the filters $20_i$ to $20n$ may be in any order in the RF filter stack 3, and may be set up to minimize coupling between adjacent frequency filters $20_i$-$20_n$ or to accommodate other criteria, such as path loss, etc. In the case of path loss optimization for example, the highest frequency filter $20_i$ may be placed at the bottom of the RF filter stack 3 to minimize via signal path length and loss by maximizing the number of stack ground vias 41 and signal ground vias $52i$ to $52n$ surrounding the filter layer $31i$ to $31n$.

Passive and active components 45 may be incorporated onto each RF filter stack 3 or into each filter layer $31i$-$31n$ for loss equalization. For example, passive low pass and/or high pass filter components, e.g. attenuators, capacitors and resistors, may be incorporated into each filter layer $31i$-$31n$ to enhance the filtering of each bandpass filter $20_i$-$20_n$. The active components 45 may be powered and controlled through interconnections from the bottom of the filter stack 3. Similarly, their information signals would use connections similar to the ones interconnecting the filters $20_i$-$20_n$ to the PCB 10 upon which the component is mounted.

Figure 3B:
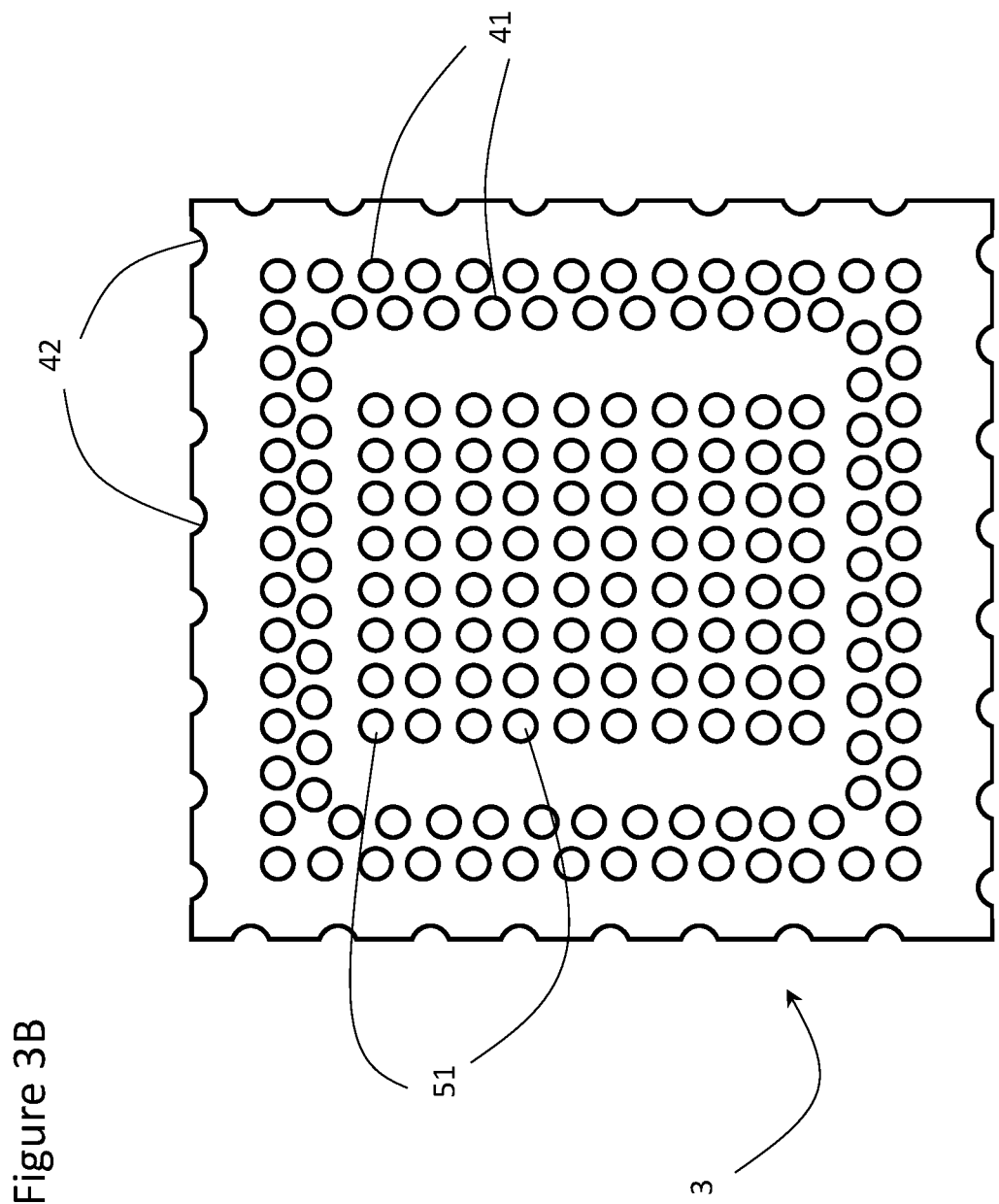
FIG. 3B is a bottom view of the filter stack of FIG. 3A.

With reference to FIGS. 3A and 3B, when not using input and output connectors 21 and 22, the RF filter stack 3 may make use of a ground-signal-ground pattern of metalized contacts 51 with different sets of signal ground vias $52i$-$52n$ extending through intermediate layers via insulated openings to each corresponding filter layer $31i$ to $31n$, e.g. vias $52ii$ extending to filter layer $31ii$, such that the signal conductive via $55ii$ would be locally shielded by the nearby signal ground vias $52ii$. The edges of the RF filter stack 3 may be shielded with a continuous or contiguous conducting arrangement, e.g. by including multiple rows of staggered stack ground vias 41 disposed around the outer edge of the filter stack 3, thereby surrounding the signal ground vias $52i$-$52n$. Alternatively or in addition, the edges of each filter $20_i$-$20_n$ may include the castellations 42. Metal deposition may also be provided around the edges of and/or between the filters $20_i$-$20n$. Each filter $20_i$-$20_n$ may include a different combination of insulative protection, e.g. ground vias, castellations and metallization than other filters $20_i$-$20_n$ in the same RF filter stack 3.

Figure 4:
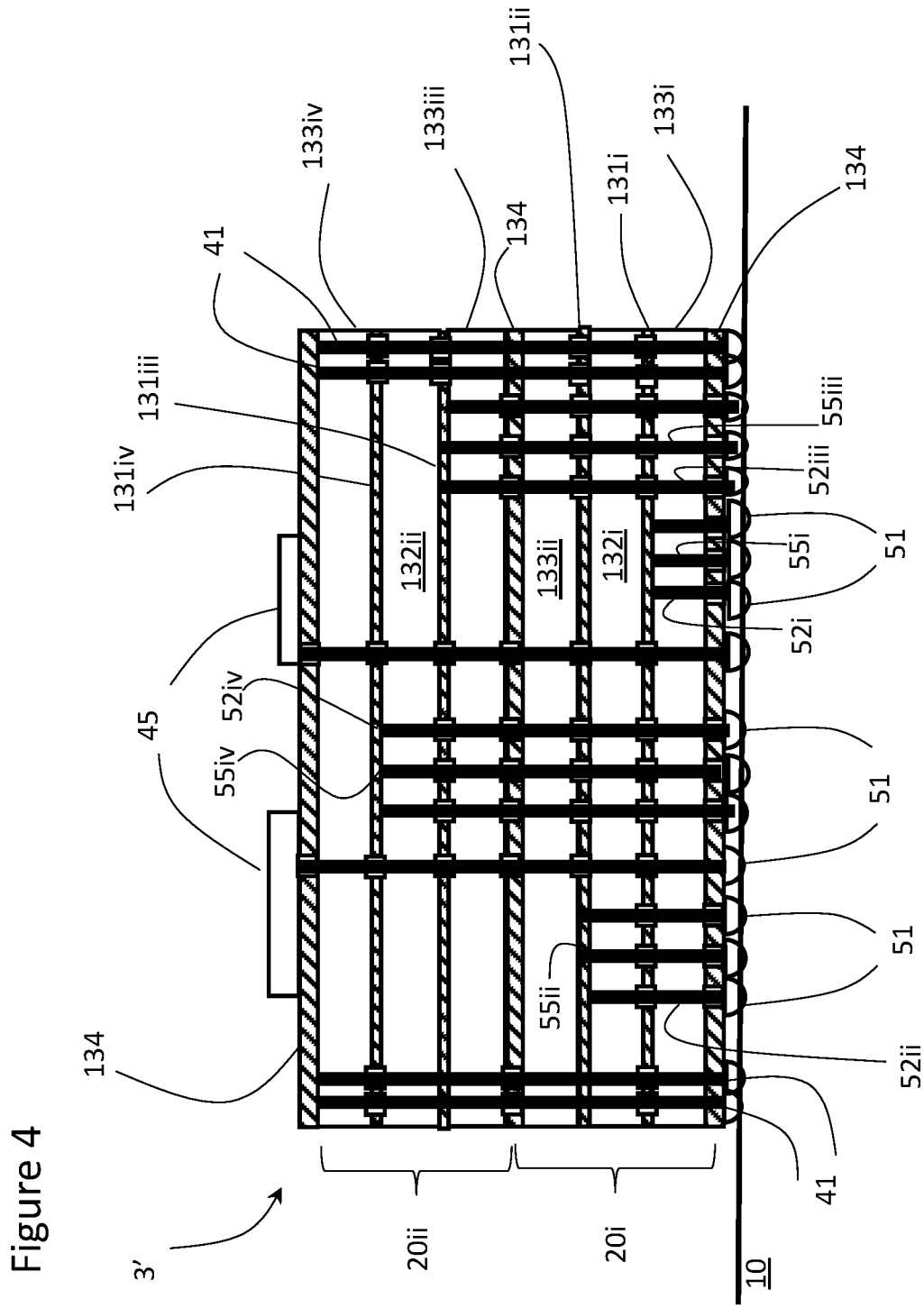
FIG. 4 is a cross-sectional view of an alternate embodiment of a filter stack of the RF filter device of FIG. 1.

With reference to FIG. 4, an alternative embodiment of the RF filter stack 3' is configured for broadside coupling where vertical coupling is provided between adjacent metallized filter layers, e.g. 131*i* with 131*ii*, and 131*iii* with 131*iv* Each of the filters $20_i$ and $20_{ii}$ may comprise first and second planar metallization filter layer 131*i*/131*ii* and 131*iii*/131*iv* (only two filter layers 131*i*-131*iii* and two filters $20_i$ and $20_n$ are illustrated for simplicity) on opposite sides of a dielectric substrate 132*i* and 132*ii*. There may be a lower dielectric layer 133*i* (133*iii*) below the first filter layer 131*i* (131*iii*), and an upper dielectric layer 133*ii* (133*iv*) above the second filter layer 131*ii* (131*iv*), whereby the filter layers 131*i* and 131*ii* (131*iii* and 131*iv*) may be sandwiched between two dielectric layers, i.e. the lower and upper dielectric layers 133*i* and 133*ii* (133*iii* and 133*iv*), but without a grounded metallization layer or shielding of any kind therebetween, enabling broadside communication between adjacent unprotected filter layers 131*i* and 131*ii* or 131*iii* and 131*iv*. However, part of a filter design may include grounded metallization, but not such that it would be meant to be shielding in nature e.g. only as a stub of a filter 131*i* to 131*iv* that happens to be grounded. The two outside (lower and upper) dielectric layers 133*i*/133*ii* and 133*iii*-133*iv* may then have metallization or ground layers 134 applied to them at their outer parallel planar surfaces. The metallization or ground layers 134 may provide the isolation boundaries between adjacent filters $20_i$ and $20_{ii}$. The filter layers, e.g. 131*i* and 131*ii* may also be formed on upper surfaces of superposed dielectric substrates, e.g. 133*i* and 132*i* (133*iii* and 132*ii*), or on separate opposed dielectric substrates, e.g. 133*i* and 133*ii* (133*iii* and 133*iv*), with an intermediate dielectric layer, e.g. 132*i* (132*ii*), therebetween. Accordingly, every two filter layers, e.g. 131*i*/131*ii* and 131*iii*/131*iv* may only be separated from each other by one dielectric layer, e.g. dielectric substrate 132*i* or 132*ii*, but separated from other pairs of filter layers, e.g. filter layers 131*iii* and 131*iv*, by two dielectric layer, e.g. upper dielectric layer 133*ii* and lower dielectric layer 133*iii* and a metallization or ground layer 134.

The dielectric substrates, e.g. 132*i*-132*ii* and 133*i*-133*iv*, may be electrically insulative, e.g. fiberglass, ceramic or glass, although semiconductor material might also be used, which would allow for one or more of the filters $20_i$-$20_n$ to be optical instead of electrical. For example, $LiNbO_3$ or other transparent or semi-transparent material could be used which would allow for opto-electrical component designs, such as a Mach-Zehnder modulator.

As described above, the ground layers 134 also provide a means to insulate each filter $20_i$-$20_n$ from the other filters $20_i$-$20_n$ by forming a shielded layer. In particular, when combined with castellations 42 around the perimeter of the stack 3, and interconnecting stack ground vias 41 and signal ground vias 52*i* to 52*iii* that electrically connect all the ground layers 134 forming multiple Faraday cages around each the filters $20_i$-$20_n$, thereby providing the insulated/isolating function.

As above, when not using input and output connectors 21 and 22, the filter stack 3' may make use of a ground-signal-ground pattern of metalized contacts 51 with different sets of signal ground vias 52*i*-52*n* and signal conductive vias 55*i* to 55*n* extending through intermediate layers via insulated openings to each corresponding filter layer 31*i* to 31*n*, e.g. signal ground vias 52*ii* and signal conductive vias 55*ii* extending to filter layer 31*ii*, such that the signal conductive vias 55*i* to 55*iv* may be locally shielded by the nearby signal ground vias 52*ii*. The edges of the filter stack 3' may be shielded with a continuous or contiguous conducting arrangement, e.g. by including multiple rows of staggered stack ground vias 41 disposed around the outer edge of the filter stack 3' surrounding the signal conductive vias 55*i*-55*n*. Alternatively or in addition, the edges of each filter 20*i*-20*n* may include castellations 42. Metal deposition may also be provided around the edges of and/or between filters $20_i$-$20_n$.

With the exception of vertical coupling, the filters $20_i$-$20_n$ may be individually shielded with interstitial ground layers 134 where the filters $20_i$-$20_n$ would be stacked above the first filter 20 at the bottom of the stack 3'. The ground layers 134 may be all interconnected to form one complete ground path.

Figure 5:
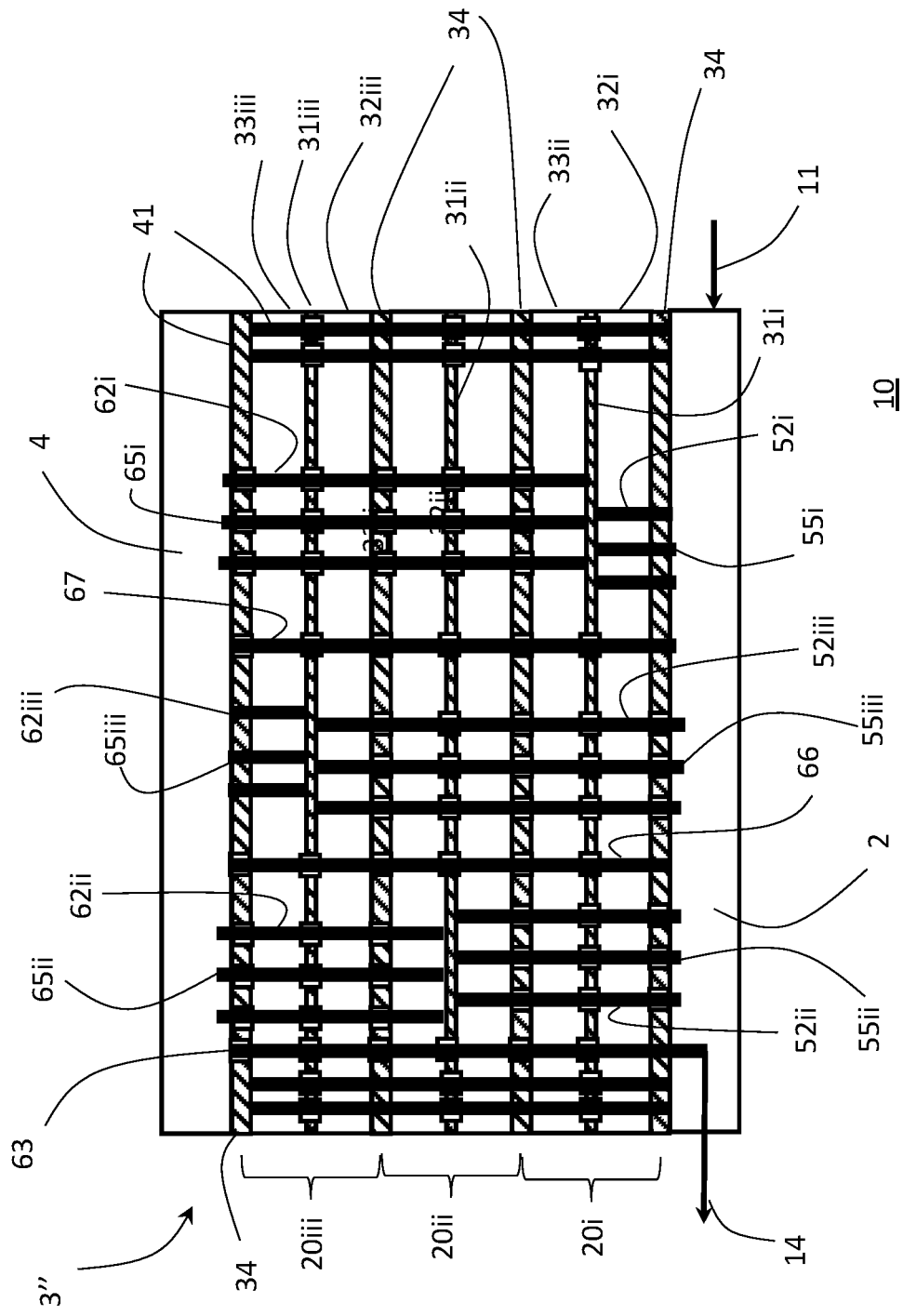
FIG. 5 is a cross-sectional view of an alternate embodiment of an RF filter device.

In alternative embodiment illustrated in FIGS. 5, the input and output switches 2 and 4 may interface into and out of a filter stack 103, which may have a filter layer, dielectric layer and ground layer structure similar to filter stack 3, 3' or 3", such that the switching is done inside or on the filter stack 103. According to the illustrated embodiment, the input and output switches 2 and 4 may be disposed within the filter stack 103, e.g. on top, within or beneath for inputting and outputting signals, respectively, from the filter stack 103. Ideally, the input switch 2 is located, e.g. on the bottom, at an opposite end of the filter stack 103 than the output switch 4, e.g. on the top, but any suitable arrangement is possible. Instead of all of the ground signal vias 52*i*-52*n* and signal conductive vias 55*i* to 55*n* extending down to the PCB 10, input vias 52*i*-52*n* and 55*i*-55*n* may extend from the input switch 2 to the corresponding filter layer 31*i*-31*n*, and output vias 62*i*-62*n* and 65*i*-65*n* would extend from the corresponding filter layer 31*i*-31*n* to the output switch 4. Accordingly, only one input 11 and one output 14, along with main output via 63 extending from the output switch 4 down through the filter stack 103 to the main output 14 is needed for the signal path, with additional control vias 66 and 67 extending from the input switch 2 to the output switch 4 being used for control and power from the PCB 10 and external control and power sources.

Figure 6A:
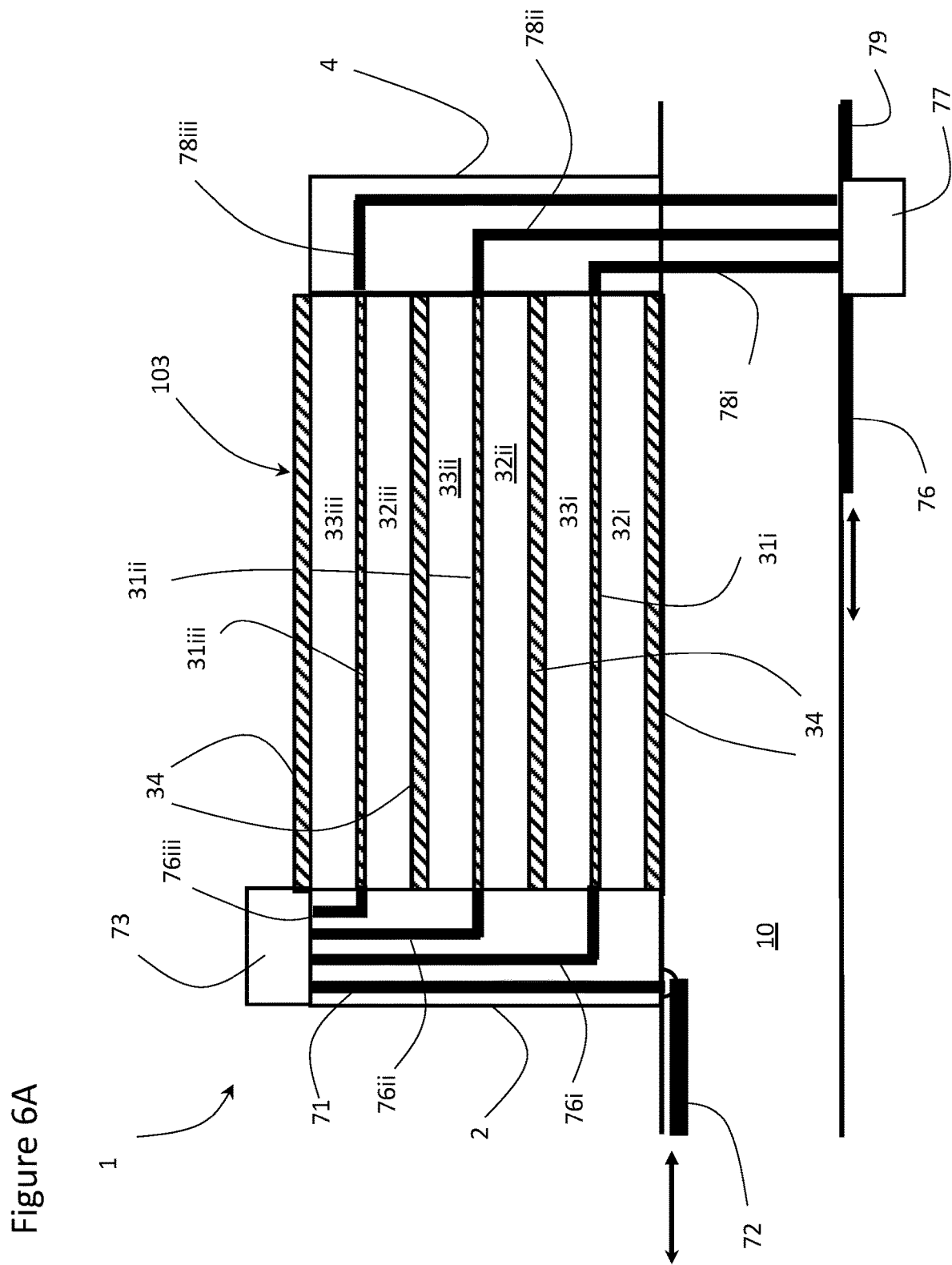
FIG. 6A is a cross-section view of an alternative embodiment of an RF filter device.
Figure 6B:
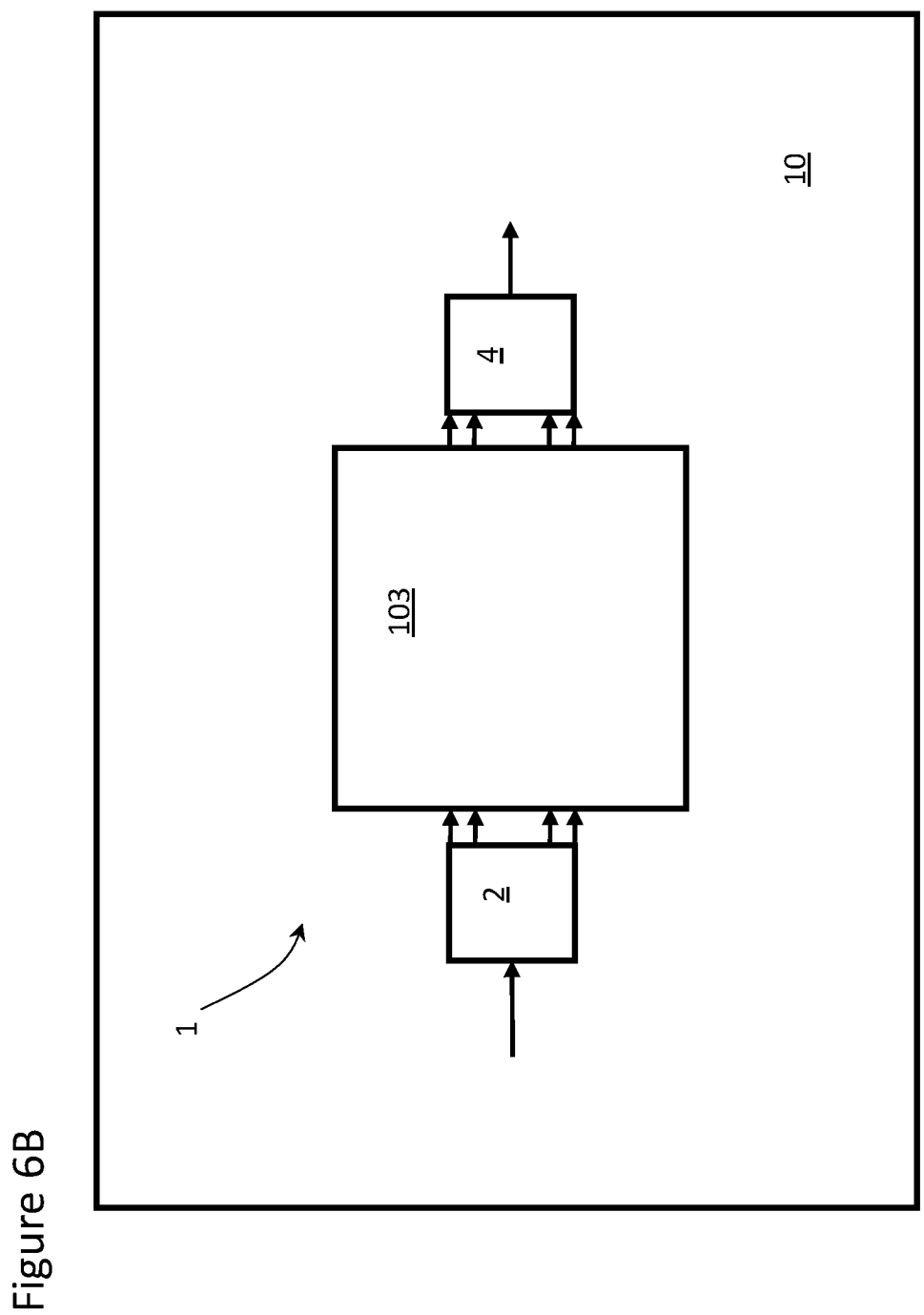
FIG. 6B is a top view of the RF filter device of FIG. 6A.
Figure 6C:
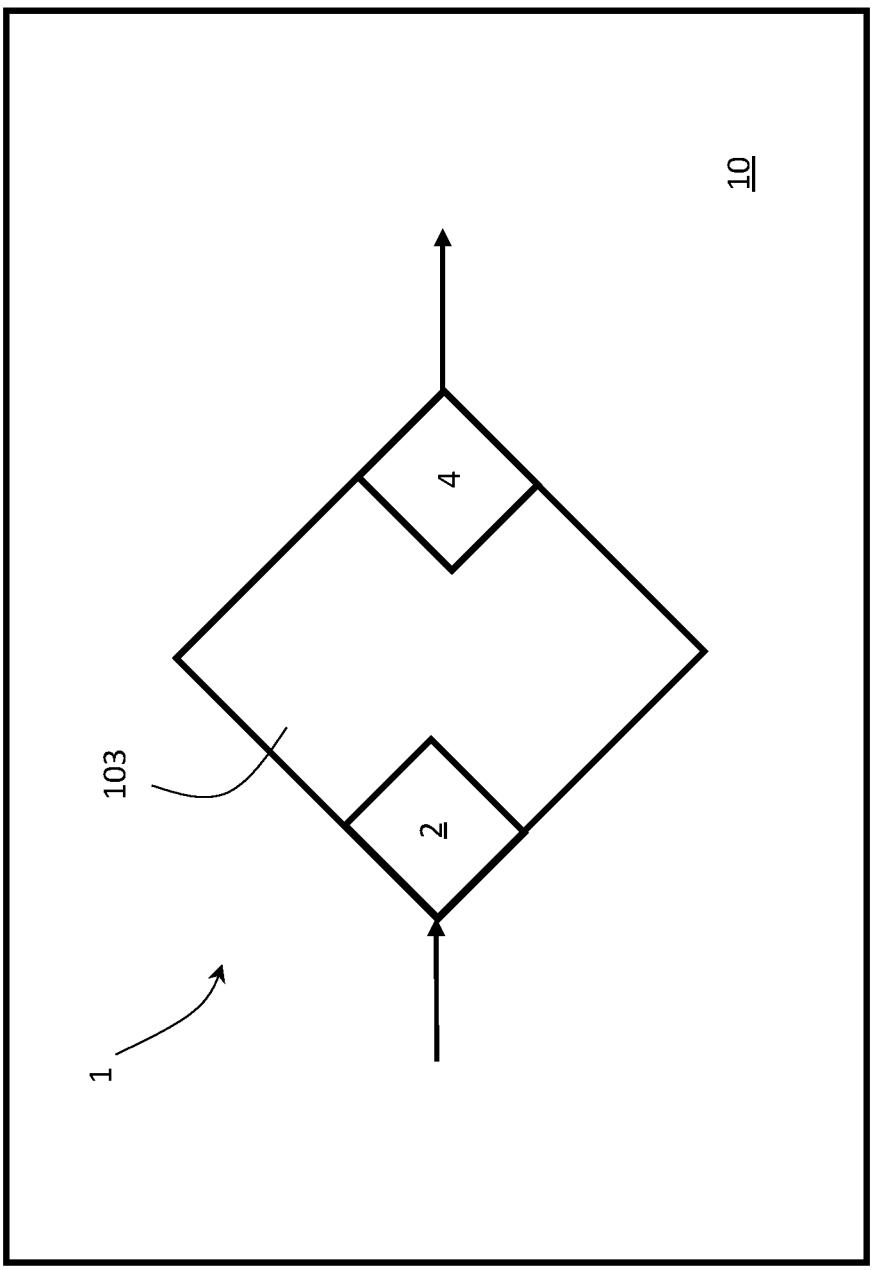
FIG. 6C is a top view of an alternative embodiment of the RF filter device of FIG. 6A.

Alternatively, as illustrated in FIGS. 6A-6C, the input and output switches 2 and 4 may be electrically connected indirectly or directly at the opposite sides of the filter stack 103 (FIG. 6B), e.g. as separate integrated circuits, or integrated into or onto the side of the stack 3 (FIGS. 6A and 6C) and extending vertically up the height of the stack 103, which may have a filter layer, dielectric layer and ground layer structure similar to filter stack 3, 3' or 3". Alternatively, each of the switches 2 and 4 may be a separate chip mounted on the PCB 10 with electrical connections extending to and from the filter stack 103. In the illustrated embodiment, for the input switch 2, signal, power and control vias 71 extend from traces 72 on the PCB 10 up to a controller 73, e.g. digital, mounted on top of the input switch 2 and the stack 3. The controller 73 may then be instructed to connect the signal via 71 to whichever filter layer 31*i*-31*iii* is desired using a selected one of the filter vias 76*i*-76*iii*. The output switch 4 may have a similar construction with control and power vias 76 extending to a controller 77 on top of the stack 103, which selects which filter via 78*i*-78*iii*, i.e. which filter layer 31*i*-31*iii*, is connected to output traces 79 on the PCB 10. Alternatively, as illustrated in FIG. 6A, the controller 77 may be positioned on the backside of the PCB 10 with the filter vias 78*i*-78*iii* extending from each filter layer 31*i*-31*iii* down through the output switch 4 and the PCB 10 to the controller 77. The control and power vias 76 and the output traces 79 may also be provided on the backside of the PCB 10. The input switch 2 may also be arranged the same way as the output switch 4, with the controller 73 on the backside of the PCB 10. As illustrated in FIG. 6C, the filter stack 103 may be arranged to maximize the length of the filter layer $31i$-$31n$ by launching the input signal in a corner of the filter stack 103 and travel diagonally across the filter stack 103 to exit the opposite corner.

Figure 7:
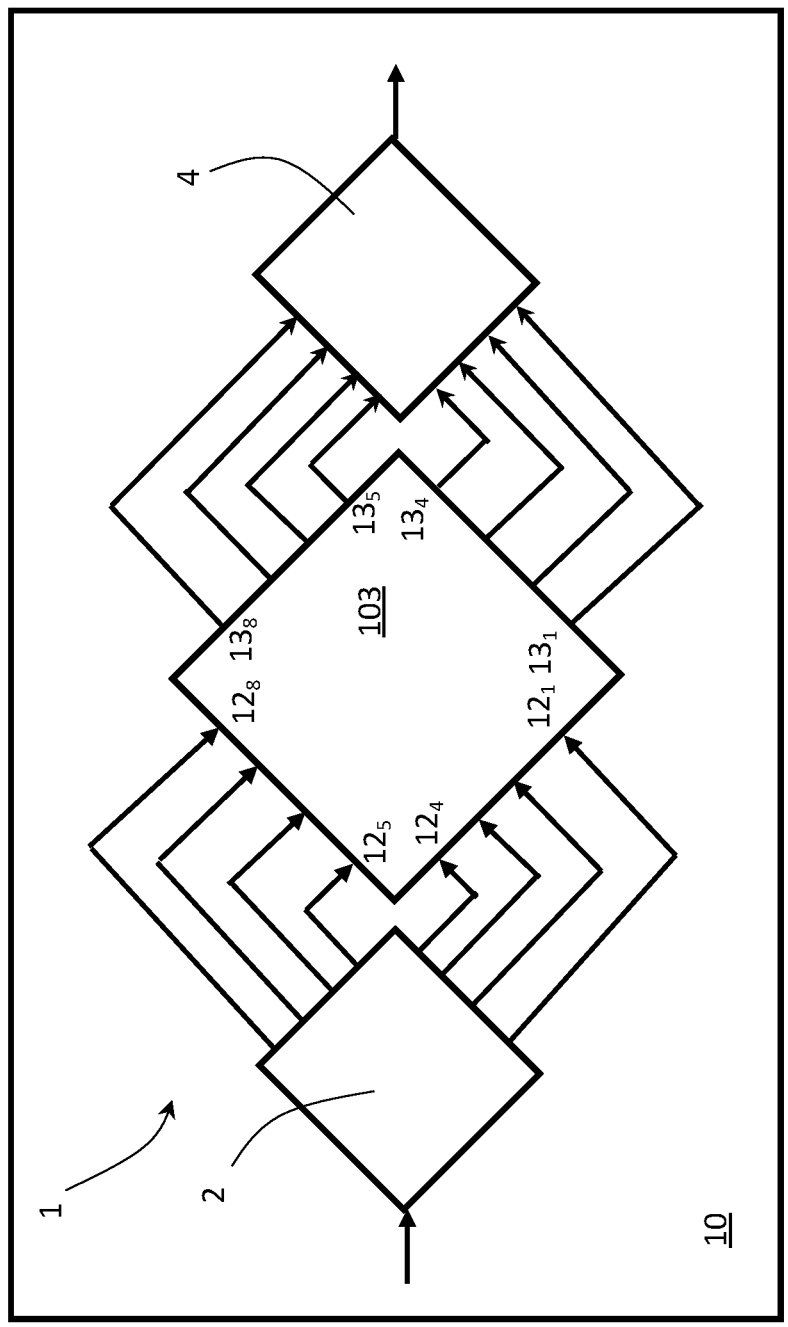
FIG. 7 is a top view of an alternative embodiment of an RF filter device.

For RF filter devices 1 with a large number of filters $20i$-$20_n$, another embodiment, illustrated in FIG. 7, may comprise the square filter stack 103, as seen from above, in which a first portion, e.g. approximately ⅓ to ⅔, of the outputs $12_1$ to $12_n$ from the input switch 2 may be on one side of the filter stack 103, with a second portion, e.g. approximately ⅓ to ⅔, of the inputs $13_1$ to $13_n$ to the output switch 4 may be on the opposite side. The outputs, e.g. outputs 125 to 128, for the second portion, e.g. half, of the filters $20_i$-$20_n$ from the input switch 4 being on one of the other free sides, e.g. perpendicular side, of the filter stack 103 with the corresponding outputs, e.g. inputs $13_5$ to $13_8$, to the output switch 4 on an opposite side thereof, e.g. a side perpendicular to the first output side. This arrangement enables close-in compact switch routing to and from the filter stack 103. Alternatively, the filter stack 103 may be broken up into multiple stacks, such that two or more signal outputs 12 and inputs 13 may be available per side up to the input and output switches 2 and 4. The interconnections of the input and output switches 2 and 4 with the filters $20_i$-$20_n$ may be all done internally to the filter stack 103, as in FIG. 6C.

Figure 8:
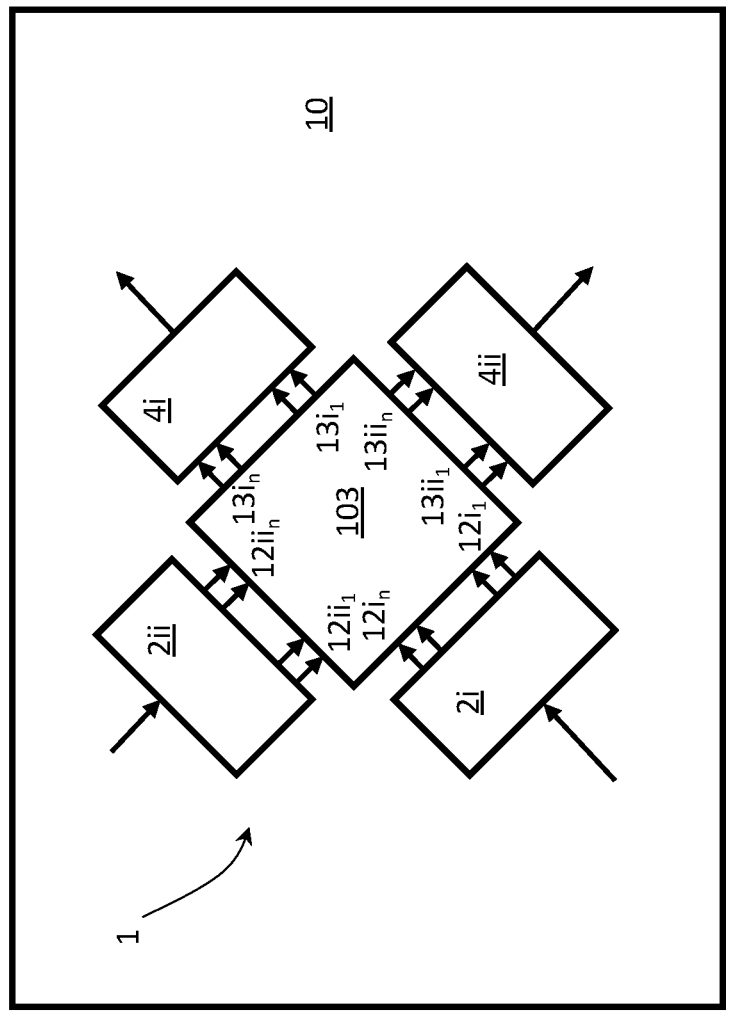
FIG. 8 is a top view of an alternative embodiment of an RF filter device.

For RF filter devices 1 with a large number of filters $20_i$-$20_n$, e.g. used for two different purposes and/or two different signals, another embodiment of the present invention, illustrated in FIG. 8, may comprise the square filter stack 103 as seen from above in which all of the outputs $12i_1$ to $12i_n$ from a first input switch $2i$ forming a first portion, e.g. ⅓ to ⅔, of the total inputs for the filter stack 103 may be on one side of the filter stack 103 with the corresponding inputs $13i_1$ to $13i_n$ from a first output switch $4i$ on the opposite side of the filter stack 103. All of the outputs $12ii_1$ to $12ii_n$ from a second input switch $2ii$, which form a second portion, e.g. ⅓ to ⅔, of the total inputs of the filters $20_i$-$20n$ being on one of the other free sides, e.g. perpendicular side, with the corresponding inputs $13ii_1$ to $13ii_n$ and second output switch $4ii$ on an opposite side thereof, e.g. perpendicular to the first output side. This arrangement enables close-in compact switch routing to and from the filter stack 103. Alternatively, the filter stack 103 may be broken up into multiple stacks, such that two or more signal outputs 12 and inputs 13 may be available per side up to the two or more input and output switches 2 and 4. The interconnections of the input and output switches 2 and 4 with the filters $20_i$-$20_n$ may be all done internally to the filter stack 3, as in FIG. 6c.

The filters $20_i$-$20_n$ in the filter stack 103 may alternate vertically from one input switch $2i$ to the other input switch $2ii$, e.g. odd numbered filters $20i$, $20iii$ and $20v$ may be connected to the first input switch $2i$, while even numbered filters $20ii$, $20iv$ and $20vi$ may be connected to the second input switch $2ii$, but any arrangement of filters $20i$-$20n$ is possible.

Figure 9:
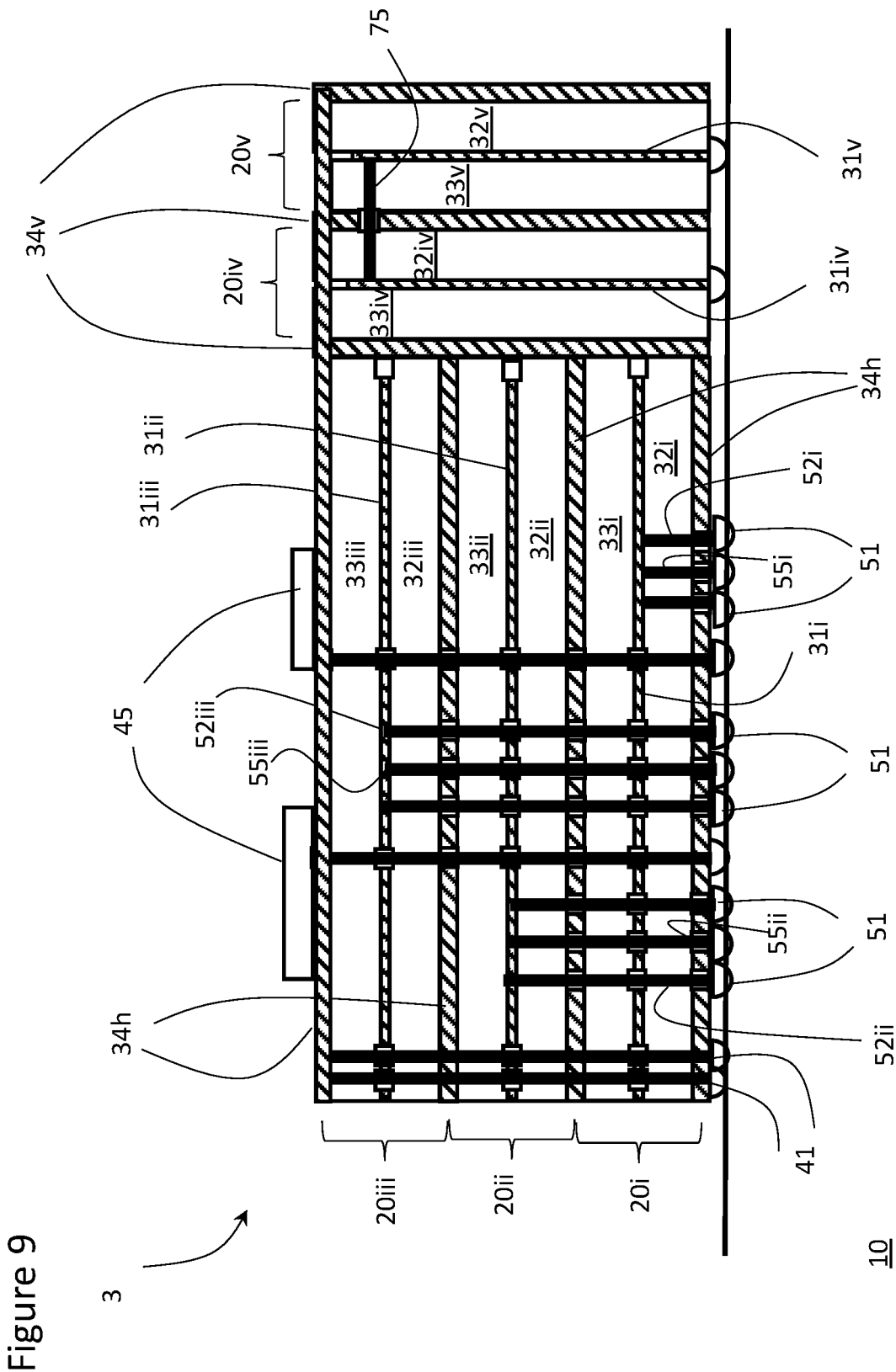
FIG. 9 is a cross-sectional view of an alternative embodiment of the RF filter stack of FIG. 1.

Another embodiment, illustrated in FIG. 9, would enable 3D operation, in which at least one of the filters, e.g. $20iv$ and $20v$ extends perpendicularly to one or more of the other filters, e.g. $20i$-$20iii$, whereby the filtering process may be enabled to be both in the vertical and horizontal planes, not restricting the filtering to being horizontal or completely coplanar in nature. The control, power and signal traces may all be provided in the PCB 10. The vertical ground layers $34v$ may be interconnected with the horizontal ground layers $34h$ and provide additional shielding for the side of the horizontal filters, e.g. filters $20_i$-$20_{iii}$. A plurality of the vertical filter layers, e.g. $31iv$ and $31v$ may be electrically connected by a horizontal via 75 extending through one or more of the vertical ground layers $34v$ and one or more of the dielectric substrates, e.g. $32iv$ and $33v$.

Another variation would allow for a waveguide cavity filter operation where the cavity would be wide but not very high. One example of this would be using substrate integrated waveguide (SIW) or just dielectric filled rectangular waveguides. Magnetic or electric field coupling into and out of the waveguide may also be provided.

Figure 10A:
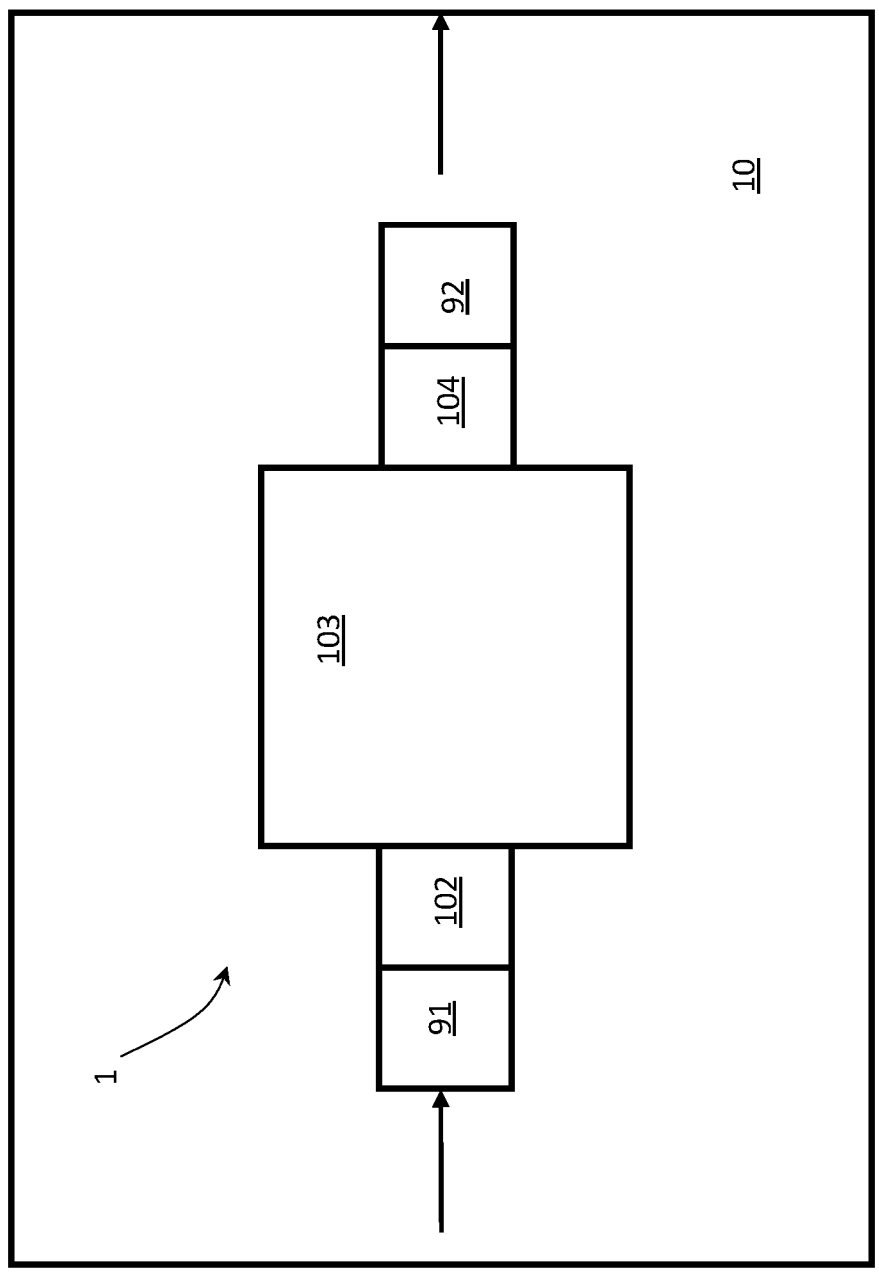
FIG. 10A is a top view of an alternative embodiment of an RF filter device.
Figure 10B:
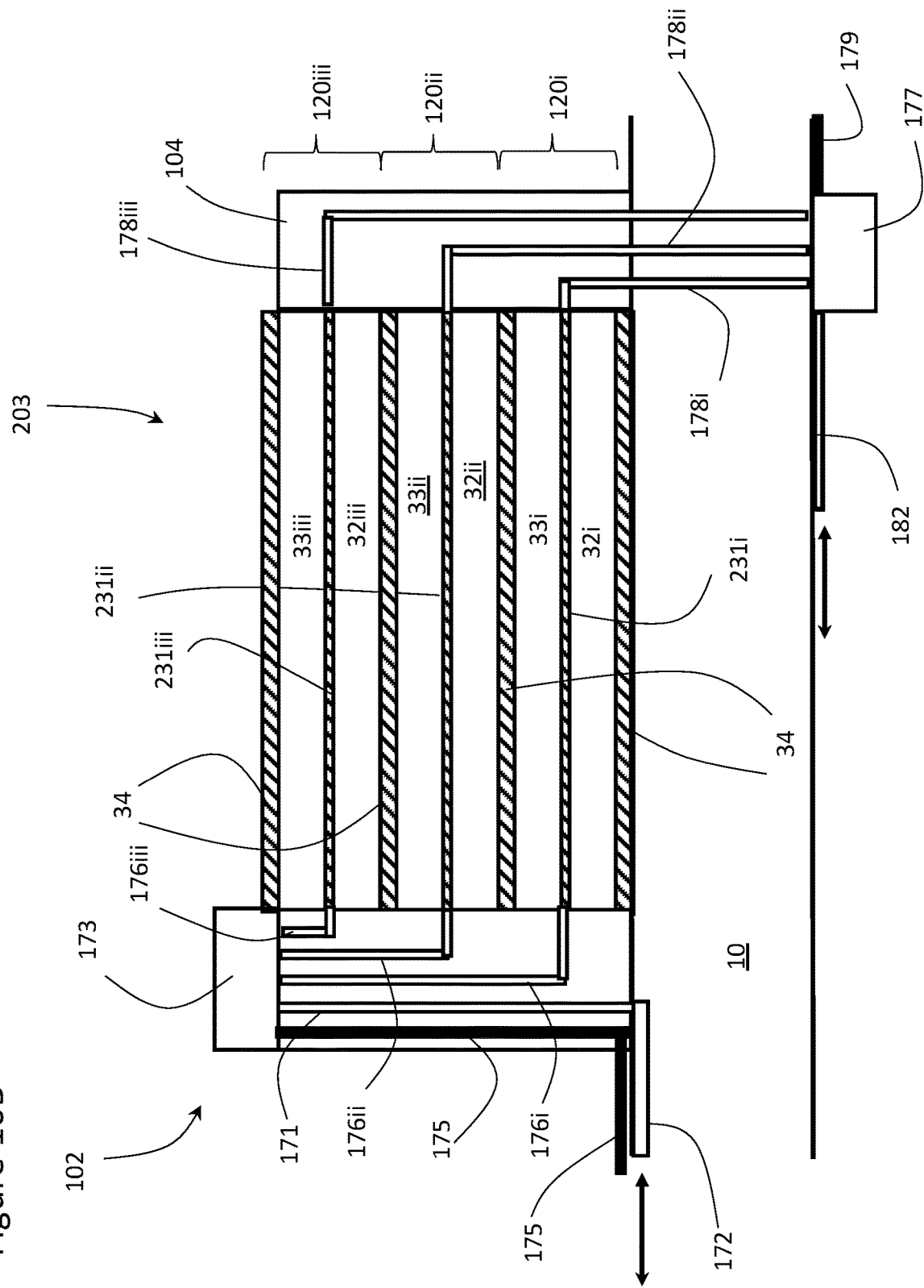
FIG. 10B is a cross-section view of the embodiment of FIG. 10A.

Another embodiment of the present invention, illustrated in FIGS. 10A and 10B enables optical up-conversion of the baseband (RF) signal using a suitable electrical to optical transducer 91, such that optical filters $120_i$-$120_n$ in a filter stack 203 may replace filter layers $20_i$-$20_n$, and the filtering may be done in the optical domain before being down-converted back to baseband (RF) using a suitable optical to electrical transducer 92. Furthermore, optical switches 102 and 104 may replace input and output switches 2 and 4. This arrangement would enable the optical filters $120_i$-$120_n$ to be used along with electro-optical components to do the electrical-optical conversion.

In the illustrated embodiment, for the optical input switch 102, power and control vias 171 extend from traces 172 on the PCB 10 up to a controller 173, e.g. digital, mounted on top of the optical input switch 102 and the filter stack 103. An input optical waveguide 175, e.g. fiber or integrated waveguide, transmits an input optical signal from the optical transducer 91 to the controller 173. The controller 173 may then be instructed to connect the input optical waveguide 175 to whichever filter layer $231i$-$231iii$ is desired using a selected one of the filter optical waveguides $176i$-$176iii$. The output switch 104 may have a similar construction with control and power vias 182 extending to a controller 177 on top of or adjacent the filter stack 203, which selects which output filter waveguide $178i$-$178iii$, i.e. which filter layer $131i$-$131iii$, is connected to output waveguide 179 on the PCB 10. Alternatively, as illustrated in FIG. 10B, the controller 177 may be positioned on the backside of the PCB 10 with the output filter waveguides $178i$-$178iii$ extending from each filter layer $131i$-$131iii$, down through the output optical switch 104 and the PCB 10 to the controller 177. The control and power vias 182 and the output waveguides 179 may also be provided on the backside of the PCB 10. The input optical switch 102 may also be arranged the same way as the output optical switch 104, with the controller 173 on the backside of the PCB 10.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An RF filter device for mounting on a PCB comprising:
   an electrical to optical transducer for converting an electrical input signal to an optical input signal;

an input optical switch including at least one input for inputting the input optical signal and a plurality of outputs;

an optical filter stack including a plurality of optical filters, each optical filter connected to one of the plurality of outputs from the input switch and capable of filtering a selected frequency range;

an output optical switch including a plurality of inputs, and at least one output for outputting a filtered optical signal, each input connected to one of the plurality of optical filters;

an optical to electrical transducer for converting the filter optical signal to a filtered electrical signal;

wherein the input optical switch and the output optical switch are mounted in or on the optical filter stack;

wherein the plurality of optical filters comprises a plurality of superposed filters, each superposed filter comprising:
an optical filter layer; and
a dielectric layer on each side of the optical filter layer.

2. The RF filter device according to claim 1, further comprising:
input conductive vias extending between the input optical switch at one of a top or a bottom of the optical filter stack and each optical filter layer; and
output conductive vias extending between each optical filter layer and the output optical switch at the other of the top or the bottom of the optical filter stack.

3. The RF filter device according to claim 1, wherein the input optical switch and the output optical switch are integrated into sides of the optical filter stack.

4. The RF filter device according to claim 1, wherein the input optical switch comprises:
an input via for receiving the input optical signal;
a plurality of filter vias, a respective filter via extending to each optical filter layer; and
a controller capable of selecting which of the plurality of filter vias the input via is connected.

5. The RF filter device according to claim 1, further comprising input conductive vias and output conductive vias extending between each optical filter layer and the PCB through intermediate optical filter layers, and intermediate dielectric layers.

6. The RF filter device according to claim 1, wherein a first one of said plurality of the optical filters extend parallel to an upper surface of the PCB; and
wherein at least a second of the plurality of optical filters extends perpendicular to the upper surface of the PCB and the first one of said plurality of optical filters.

7. The RF filter device according to claim 1, wherein each optical filter includes an electrical connector for mating with a corresponding electrical connector of the input optical switch.

8. An RF filter device for mounting on a PCB comprising:
an electrical to optical transducer for converting an electrical input signal to an optical input signal;

an input optical switch including at least one input for inputting the input optical signal and a plurality of outputs;

an optical filter stack including a plurality of optical filters, each optical filter connected to one of the plurality of outputs from the input switch and capable of filtering a selected frequency range;

an output optical switch including a plurality of inputs, and at least one output for outputting a filtered optical signal, each input connected to one of the plurality of optical filters;

an optical to electrical transducer for converting the filter optical signal to a filtered electrical signal;

wherein the plurality of optical filters comprises a plurality of superposed filters, each superposed filter comprising:
an optical filter layer;
a dielectric layer on each side of the optical filter layer; and
metal insulation layers above and below the dielectric layers for insulating each optical filter from other optical filters above and/or below.

9. The RF filter device according to claim 8, further comprising insulating conductive ground vias extending through the optical filter stack around a periphery thereof, insulated from each of the optical filter layers and connected to the metal insulating layers.

10. The RF filter device according to claim 8, wherein one of the metal insulation layers of one optical filter also comprises one of the metal insulation layers of one of the optical filters there above or there below.

11. The RF filter device according to claim 8, wherein each optical filter layer and each metal insulation layer includes castellations at outer edges thereof.

12. The RF filter device according to claim 8, further comprising an input conductive via and an output conductive via extending between each optical filter layer and the PCB through intermediate optical filter layers, intermediate dielectric layers, and intermediate metal insulation layers.

13. The RF filter device according to claim 8, further comprising input conductive vias and output conductive vias extending between each optical filter layer and the PCB through intermediate optical filter layers, and intermediate dielectric layers.

14. The RF filter device according to claim 8, wherein a first one of said plurality of the optical filters extend parallel to an upper surface of the PCB; and
wherein at least a second of the plurality of optical filters extends perpendicular to the upper surface of the PCB and the first one of said plurality of optical filters.

15. The RF filter device according to claim 8, wherein each optical filter includes an electrical connector for mating with a corresponding electrical connector of the input optical switch.

* * * * *